United States Patent [19]

Kelly et al.

[11] Patent Number: 4,520,310

[45] Date of Patent: May 28, 1985

[54] AUTOFUNCTION VOLTMETER

[75] Inventors: Austin T. Kelly, Morris Plains; Alan H. Stolpen, Union; Philip Emile, Jr., Roseland, all of N.J.

[73] Assignee: Sycon Corporation, Marion, Ohio

[21] Appl. No.: 389,723

[22] Filed: Jun. 18, 1982

[51] Int. Cl.$^3$ .................. G01R 15/08; G01R 17/02
[52] U.S. Cl. .................................................. 324/115
[58] Field of Search ............... 324/115, 133, 158 MG; 364/483

[56] References Cited

U.S. PATENT DOCUMENTS

| | | | |
|---|---|---|---|
| 3,237,102 | 2/1966 | Newell | 324/115 |
| 3,345,562 | 10/1967 | Rockwell | 324/115 |
| 3,536,998 | 10/1970 | Nordholm | 324/115 |
| 3,614,610 | 10/1971 | Legatti | 324/115 |
| 3,629,704 | 12/1971 | Stevens | 324/158 MG |
| 4,092,591 | 5/1978 | Lozowski | 324/115 |
| 4,156,845 | 5/1979 | Muellner et al. | 324/158 MG |

OTHER PUBLICATIONS

"New Concept Digital Multimeters", *Hioki Digital Hi Tester*, Cat. No. 3207E, Nagano, Japan, Jan. 1980.

Primary Examiner—Stewart J. Levy
Assistant Examiner—S. Baker
Attorney, Agent, or Firm—Fay & Sharpe

[57] ABSTRACT

Circuitry for use in a voltage measurement and display device provides automatic function change for measurement of AC or DC voltages. Voltage measurement in a predetermined mode (DC, for example), is assumed. Upon detection of an input voltage component exceeding a predetermined threshold of the other mode, (AC, for example), the measurement function is changed to that other mode. Upon detection of a component in the other mode, in a range between the predetermined threshold and a second (preferably lower) threshold, an annunciator is activated to alert the user to the presence of the other mode (AC) voltage, for manual activation of a function-selecting switch if desired. Thus, in a specific embodiment, automatic function changeover is provided upon detection of AC components exceeding a predetermined threshold, along with activation of an AC annunciator. Alternatively, in the presence of low magnitude AC ripple voltage components on a DC voltage being measured, the annunciator is activated to attract the operator's attention, with measurement continuing in the DC function.

15 Claims, 6 Drawing Figures

1

AUTOFUNCTION VOLTMETER

BACKGROUND ART

This invention relates to voltage measurement devices, and more particularly to voltmeters capable of measuring AC and DC voltages.

On many occasions, service personnel or other users of voltage measuring equipment need to know whether a particular line carries AC line voltage, DC voltage, or DC voltage with an AC ripple, as well as the magnitudes of these voltages. Further, such information is frequently needed on an urgent basis, or under circumstances wherein it is inconvenient for the user to manipulate various dial settings on a voltmeter.

The prior art has accordingly developed a number of AC/DC voltage reading voltmeters. For example, U.s. Pat. No. 3,536,998 to Nordholm discloses a measuring system for AC and DC voltages. The system is complex, however, requiring the use of a pair of polarity sensing circuits and a reversing switch assembly which provides an output to a meter circuit through a voltage-range control. The disclosed system assumes that incoming voltage is either AC or DC, and filters out all AC components when a DC measurement is being performed. The presence of AC voltage is detected by noticing that both polarity-sensing circuits have been activated.

U.S. Pat. No. 3,614,610 to Legatti discloses a voltage tester providing neon light indicators of the range of voltage operation as well as the polarity and frequency of operation. Voltages below the minimal operating range are indicated by flashing of yet a further indicator. The patented device, however, provides no display of the actual voltage magnitude. Moreover, no provision is made for a situation wherein a voltage includes both AC and DC components.

U.S. Pat. No. 4,092,591 to Lozowski provides separate LED indicators of particular AC or DC voltage ranges and otherwise suffers from problems similar to those in U.S. Pat. No. 3,614,610.

A simplified AC/DC meter is described in U.S. Pat. No. 3,345,562 to Rockwell. In this disclosure, however, no indication is provided of whether the displayed voltage is AC or DC. There is thus neither an identification of the particular function being performed by the meter nor an identification of the type of voltage being measured thereby.

DISCLOSURE OF THE INVENTION

It is accordingly an object of the present invention to overcome the deficiencies of the prior art and to provide a voltage measuring system which automatically changes its operation between the AC and DC voltage measurement functions and which indicates to the user the specific function being performed thereby.

It is a more specific object of the invention to provide a circuit useable in a voltage measuring device, the circuit providing for operation of the device in one mode (DC, for example) unless the input voltage is determined to include a component of the opposite mode (AC, for example) exceeding a predetermined threshold.

It is another object of the invention to provide a circuit useable in a voltage-measuring device for automatically alternating the functioning of the device between AC and DC measurement modes in response to detection of a change in the character of the input voltage, and to provide an indication to the user of the specific mode of operation.

Still another object of the invention is the provision of a circuit for enabling a voltage-measuring device to measure and display the magnitude of an input DC voltage while simultaneously determining and displaying whether the input voltage includes an AC component.

It is an additional object of the invention to announce to the user that a low level AC component has been detected in a DC voltage, and to give the user an option of continuing the DC display or of switching to an AC measurement and display mode.

Yet a further object of the invention is the provision of an indication to the user than an AC component of an input DC signal exceeds a predetermined first threshold, and automatically to change the function of the device to AC measurement when the input voltage is determined to have an AC component exceeding a second threshold.

Another object of the invention is the provision of an autofunctioning voltage measuring device for automatically displaying DC or AC voltage magnitudes and an indication of the AC or DC measurement function being performed, along with an autoranging function for either or both AC and DC voltages being measured.

Yet another object of the invention is the provision of a circuit for operating an LCD annunciator in an off, on, or flashing mode to indicate the presence of DC, AC, and mixed voltages.

In accordance with these and other objects, the present invention includes circuitry for alternating operation of a voltage measuring device between AC and DC modes. The circuitry includes a comparator for comparing a predetermined first reference voltage with the output of an AC to DC converter used in the measuring device. Controlled switching means are provided for connecting either the output of the AC to DC converter, or the input voltage, to a measurement and display device for displaying AC or DC voltage magnitudes. The controlled switching means are connected to respond to the output of the comparator by connecting the converter output to, and disconnecting the input voltage from, the measurement and display device, and vice versa.

In accordance with more specific objects of the invention, the invention includes a second comparator for comparing the converter output with a second, lower, reference voltage. A display control device responds to the second comparison by causing a function annunciator to indicate that a DC input voltage has an AC component between the first and second reference values.

Preferably, the function annunciator used in conjunction with the present invention is of the liquid crystal display type, and the display control includes circuitry for activating the annunciator in one mode when the input voltage includes an AC component between the first and second reference levels, and in another mode when the input voltage is an AC voltage, or includes an AC component above the first reference level. More specifically, circuitry is provided for flashing the LCD annunciator in one of the operating modes (DC with AC ripple) and for continuously activating the LCD annunciator in the other operating mode (AC above first reference level).

The display control structure preferably includes an exclusive-OR or similar gate for exciting the LCD annunciator with a signal in phase or out of phase with the back plane signal thereof, provided at one input terminal of the control gate, by providing a logically determined control signal at the other input to the control gate.

In accordance with another feature of the invention, autoranging circuits may be provided for either or both of the AC or the DC signal paths.

BRIEF DESCRIPTION OF DRAWINGS

These and other features, objects and advantages of the present invention will become more readily apparent upon reference to the following description of a best mode for carrying out the invention, when taken in conjunction with the accompanying drawings in which.

BEST MODE FOR CARRYING OUT THE INVENTION

Figure 1:
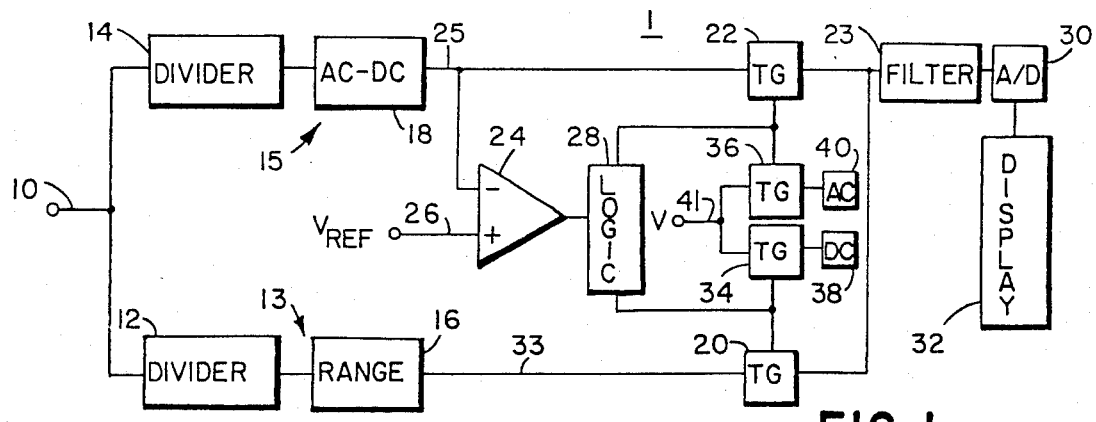
FIG. 1 shows a block diagram illustrating the principles of the present invention.

The present invention is broadly illustrated at 1 in the block diagram of FIG. 1, wherein an input voltage for the voltage-measuring device is connected to terminal 10. The voltage is provided for DC or AC measurement by passing through appropriate voltage dividers 12 and 14, in DC and AC circuit branches, 13 and 15, respectively. The input ground terminal is not shown.

A DC autorange control circuit 16 is shown in the DC branch 13, although it should be appreciated that the present autofunction operation differs from, and is independent of, the autoranging function. Accordingly, an autorange control circuit is not shown for the AC branch 15. However, autoranging may be provided in either, neither, or both the DC and AC measurement branches.

An AC to DC converter 18 is provided for the appropriately scaled input voltages. Such a converter is well-known in the prior art and will be described in greater detail with respect to FIG. 4. There is thus provided at the inputs to a pair of transmission gates 20 and 22 the appropriately scaled input voltage and a voltage representing an AC to DC conversion of the input voltage, respectively. A comparator 24 receives at its inverting input the DC output of converter 18 from output line 25, and at its non-inverting input a reference voltage on line 26 from a reference voltage source (not shown). These connections are illustrative, however. The reference may be connected to the inverting input and the converter output voltage connected to the non-inverting input.

As will be appreciated by those skilled in the art, the output of comparator 24 will be at a logic one level for values of the DC voltage on line 25 below the reference value on line 26, and will be at a logic zero level when the output DC voltage on line 25 exceeds the value of the reference voltage on line 26. This voltage is used to control the two transmission gates 20 and 22, allowing them to pass either the DC converted form of the input AC voltage or the input voltage itself (as scaled in dividers 12 and 14) to be measured and displayed. A logic control circuit 28 is provided to convert the output signals of comparator 24 to the appropriate form for controlling the transmission gates 20 and 22. The appropriate voltage is transmitted through one of gates 20 and 22 to a filter 23 for filtering variations therein prior to detection of the voltage magnitude by an analog-to-digital converter 30. The output of analog-to-digital converter 30 is used to drive an output digital display 32.

It should be recognized that filter 23, converter 30 and display 32 are not an integral part of the present invention, and may be replaced by any voltage measurement and display apparatus, including a wound coil galvanometer, for example. Further, the comparison of the voltage on line 25 with a reference may be replaced instead by comparison of the voltage in the DC branch on the input line 33 to transmission gate 20. Alternatively, the voltage levels on both lines 25 and 33 may be compared with desired reference levels. In any case, the voltage lines may be input to the non-inverting or to the inverting terminals of the comparators provided.

The circuitry shown in FIG. 1 provides for a comparison of the AC signal with a reference, and for activation of transmission gate 22 when the output of comparator 24 is in the logic zero state. That is, when first connecting the voltage measuring device to a specific voltage on line 10, transmission gate 22 is in a non-transmitting state and transmission gate 20 is in a transmitting state. Thus, the input voltage (after appropriate ranging) is passed directly to filter 23 for measurement and display. The present circuit is designed to assume DC input voltages. In the event that the voltage at terminal 10 includes an AC component above the desired threshold level represented by the reference voltage on line 26, the states of the transmission gates are interchanged. Transmission gate 20 becomes closed (non-conducting) and transmission gate 22 is opened, thereby to present an appropriately scaled and rectified form of the input AC voltage for measurement and display. The threshold voltage may correspond to a value approximately equal to line voltage, or may be any desired value. Moreover, the reference voltage may be adjustable. In the best mode for carrying out the invention, the reference voltage corresponds to an AC voltage of 20 volts, so that for input voltages having AC components of less than 20 volts, DC measurement will be made and displayed. If the input voltages includes an AC component (or is in its entirety an AC voltage) greater than 20 volts, the scaled and converted form of the input is passed for measurement and display, along with an indication to the user that the display refers to an AC voltage.

It will be understood that the various circuit modifications previously described, pertaining to connection of the DC branch voltage to comparator 24 or to the connection of the reference voltage to the inverting terminal thereof, change the operating mode of the invention. Specifically, DC measurement may be assumed unless the AC voltage is below a particular threshold. Alternatively, if AC isolation is provided for the DC path, AC measurement may be assumed unless the DC (or AC) voltage is above or below a desired threshold. In all such modifications of the circuit of FIG. 1 an automatic function change (between AC and DC measurement and display) is provided in response to a comparison of a portion of the input voltage with a reference voltage. As a result of the comparison, the output of the AC to DC converter is connected to or disconnected from the measuring and display circuits, while the (DC) input voltage is disconnected from or connected to these circuits, respectively.

In that regard, attention is called to a further pair of transmission gates 34 and 36, and to annunciators 38 and 40 which display to the user a symbol indicative of DC or AC operation, respectively. The annunciators may take any form. Audible as well as visible annunciation is contemplated. Typical annunciators may be excited by a voltage 41 connected to the transmission gates 34 and 36 and passed therethrough to the annunciators. Alternatively, the annunciators may form a portion of display 32. It should also be appreciated that a single annunciator will suffice. That is, a single annunciator in an on or off condition may provide similar information as provided by two annunciators only one of which is on at any one time.

Figure 2A:
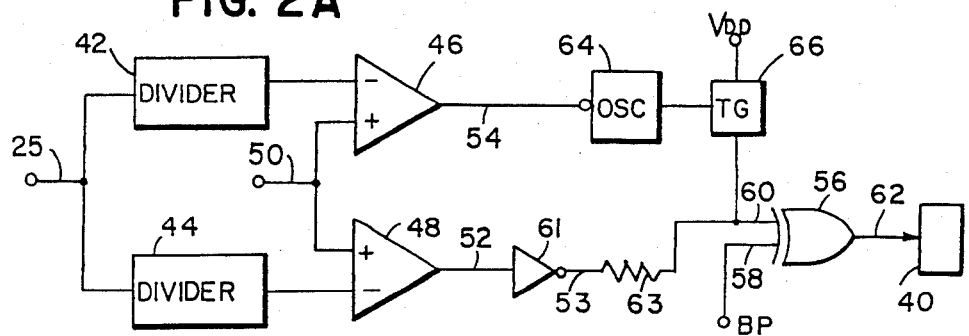
FIGS. 2A and 2B illustrate two circuits for activating an LCD annunciator to indicate the mode of operation of the measuring device.

Preferably, display 32 and the appropriate annunciators are formed as part of a common liquid crystal display. In that regard, reference is made to FIG. 2A wherein a particular control circuit is shown for operating one such (AC) annunciator 40. The circuit of FIG. 2A illustrates a further advantage of the present invention. Specifically, a single annunciator may be used to provide user information both as to AC or DC mode of operation, as well as to provide an indication of the presence of AC ripple on a DC signal. Of course, DC annunciator 38 may be used instead.

The function of the circuit in FIG. 2A accordingly is to provide a second reference voltage, lower than the first reference voltage, for comparison with the voltage output by AC to DC converter 18, and to provide an indication to the user that the input (DC) voltage has an AC ripple component, lower than the first reference voltage but higher than the second reference voltage. The first reference in the present invention corresponds to 20 volts AC, and a second reference may correspond to two volts for accurate representation of 10 percent of a full scale measurement.

As seen in FIG. 2A, the voltage from line 25 may be provided through a pair of voltage dividers 42 and 44 to a pair of comparators 46 and 48, respectively. This configuration is used to enable a single reference voltage, provided on line 50, to be used for both low and high threshold comparisons. Specifically, the comparator 48 compares an appropriately attenuated form of the voltage on line 25 with the reference voltage on line 50. Comparator 46 compares a different fraction of the voltage on line 25 with the same reference voltage. Alternatively, two different reference voltages may be provided for direct comparisons with the unattenuated voltage on line 25. As will be appreciated, the two comparators provide output changes at different threshold values of the voltage on line 25 because of the different division ratios of voltage dividers 42 and 44. Preferably, comparator 48 changes states at precisely the same point as does comparator 24 in FIG. 1. Thus, the output of comparator 48 on line 52 is at a logic zero level whenever the input AC voltage component exceeds 20 volts, while the output of comparator 46 on line 54 is at a logic zero level whenever the input AC voltage component exceeds two volts, for example. Accordingly, the circuit of FIG. 2A may readily be modified by the elimination of voltage divider 44 and comparator 48, and by connection of line 52 to the output of comparator 24, or by the connection of line 60 to the output of logic circuit 28 used to control transmission gate 22.

For the situation in which the AC annunciator 40 forms part of a liquid crystal display having a back plane and a back plane signal applied thereto, the circuit of FIG. 2A provides a steady display of the AC annunciator when the voltage on line 52 is at a logic zero. This is apparent inasmuch as an exclusive-OR gate 56 is connected thereto. Accordingly, when the voltage on line 60 is at logic one level, the output of the exclusive-OR gate is the inverted form of the signal on line 58. That is, the signal on output line 62 will be out of phase with the back plane signal on line 58 whenever line 60 is at a logic one level. It will thus be appreciated that whenever the output of the high threshold comparator is at logic zero, an inverter 61 provides a logic one to line 60. Accordingly, the output of exclusive-OR gate 56 will be out of phase with the back plane signal, and when applied to the AC annunciator will cause the annunciator to be activated for constant display. However, whenever the signal on line 60 is at logic zero, the output on line 62 is in phase with the back plane signal on line 58. Application of the output signal to the liquid crystal annunciator will thus result in the annunciator being inactive.

In the intermediate range, when comparator 46 provides a logic zero output signal and comparator 48 provides a logic one output signal, a controlled oscillator 64 is enabled to control a transmission gate 66 periodically to transmit the high level supply voltage $V_{DD}$ to line 60. Resistor 63 allows the high level to reach line 60 while the output of 61 (line 53) is still at a low (logic zero) level. The signal on line 60 thus alternates between logic zero and one values, thereby providing an output signal on line 62 which is periodically in phase and out of phase with the back plane signal on line 58. This signal thus periodically activates the annunciator, causing the desired flashing effect.

Controlled oscillator 64 may be a divide-by-16 circuit receiving as its input the back plane signal, which is typically a 30 Hz oscillating signal. The output of the divide-by-16 circuit, when enabled by the voltage on line 54, is accordingly a pulsating signal at 1.875 Hz periodically enabling the transmission gate 66, thereby causing the AC annunciator 40 to flash at a rate slightly less than twice per second.

Figure 2B:
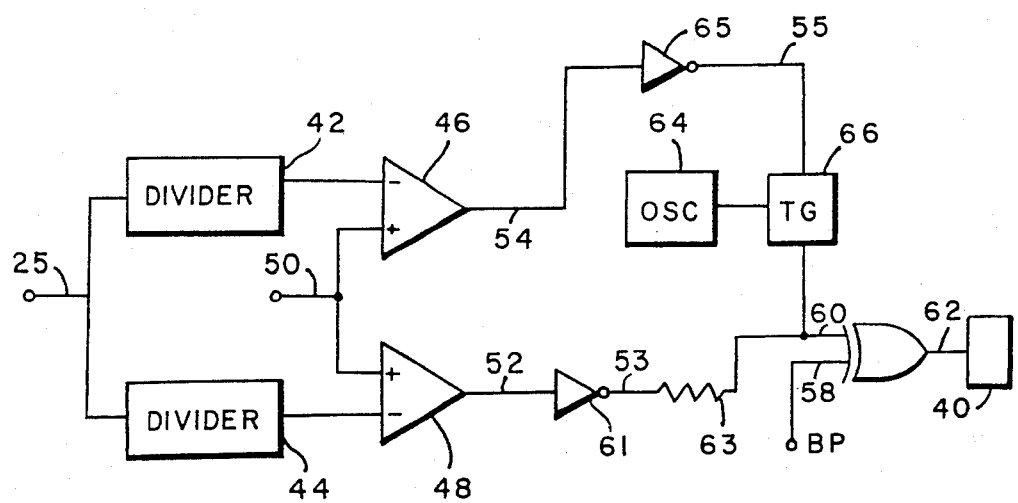

Still a further alternative for the annunicator-flashing control circuit is the use of a continuously-oscillating signal as the control signal for transmission gate 66, for periodically passing the output of comparator 46, inverted by inverter 65, through the gate to line 60. Thus, as shown in FIG. 2B, when the output of comparator 46 is at a low, or logic zero, level, line 55 will be high, a logic one, and an oscillating signal will be present on line 60 of exclusive-OR gate 56. When the output of comparator 46 is at a high level, line 55 will be low, and the presence of the oscillating signal at the control input for transmission gate 66 will not change the signal applied to line 60. When the input level further increases sufficiently to cause the output of comparator 48 to go low, line 60 will go high continuously, causing a steady display on annunciator 40. The above condition is reached because the output of comparator 46 goes low before the output of comparator 48, and once line 52 goes low, line 53 goes high, and there is no voltage difference across transmission gate 66. Therefore whether the continuous oscillator enables or disables gate 66, line 60 remains at a high level and line 62 is out-of-phase with line 58, the backplane. This approach is preferable for a voltmeter of the type including an audio oscillator to provide audible signals to the user. As hereinafter described, the present invention is intended for use in a voltmeter having an oscillator output signal generated by an A/D converter IC chip. The audio frequency signal may thus be divided by an internal divider circuit avoiding the need for a separate oscillator to provide the control signal for transmission gate 66.

Figure 3:
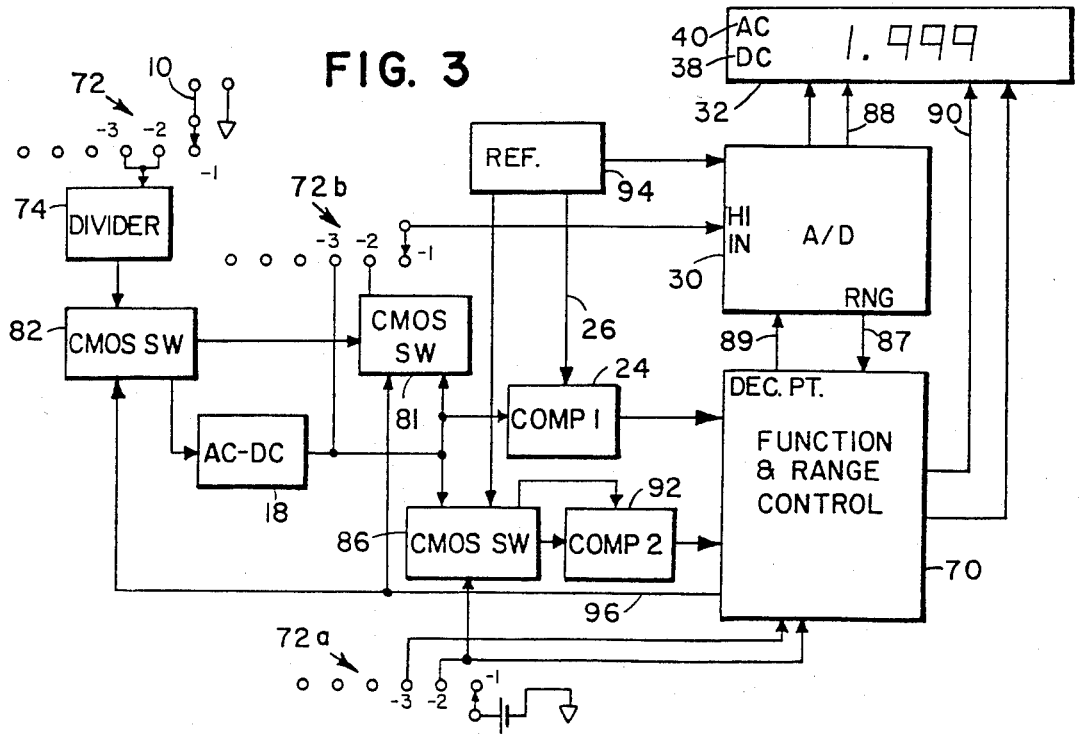
FIG. 3 shows a block diagram of a circuit for implementing the functions of FIG. 1.

Referring now to FIG. 3, the present circuitry is shown in the environment of a multi-function voltmeter. Therein, the switching circuitry, AC to DC converter, A/C converter, and comparators of FIGS. 1 and 2 are generally shown in block diagram, along with a function and range control circuit 70.

In the Figure, input voltage is applied through a multipole function switch 72 to a divider 74. Several controlled CMOS switches 81, 82 and 86 are provided. Switch 82 represents a more complicated switching arrangement for both range setting and function setting, while switch 86 represents two switches having a common control and providing two inputs to a comparator 92.

The switches are controlled by control circuit 70 and by voltage applied to a particular pole of a separate multipole switch 72a, ganged with switch 72. The appropriately scaled voltage is provided through a third ganged multipole switch 72b to the A/D converter 30, which provides up-range and down-range signals on line 87 to control circuit 70 and display coded signals on lines 88 to display 32. Control circuit 70 in turn provides decimal point control signals on lines 89 to converter 30, and display control signals on lines 90 for activation of specified annunciators on display 32.

The multipole switches are shown in the "off" position, with the armatures thereof connected to their respective first poles 72-1, . . . 72b-1. Connection to the second poles 72-2, . . . 72b-2, is used to indicate operation in the voltage measuring autofunction mode, while connection to the third poles 72-3, . . . 72b-3, is made for operation in the "ripple" or "AC" measurement mode.

In operation, switches 81 and 82 are each in a DC input configuration when multipole switches 72, 72a and 72b are set to their respective voltage measuring connections. Thus, the armature of switch 72 receives the input voltage from line 10. It is subsequently scaled by divider 74, and directed via switches 82, 81 and 72b, for application to converter 30. AC-DC converter 18 simultaneously receives an appropriately scaled form of the input voltage through switching arrangement 82, and provides the same directly to comparator 24 for comparison with a high reference, and via one of switches 86 to comparator 92. Comparator 92 compares the detected AC input voltage with a low threshold reference obtained from a reference circuit 94 via the other of the switches 86. In this mode, control circuit 70 provides an output voltage on lines 90 to activate DC annunciator 38.

Upon detection by control circuit 70 that comparator 24 senses that the AC voltage component exceeds the higher reference, circuit 70 provides an output signal on line 96 to cause switch 81 and an appropriate one of the switches in arrangement 82 to change to the AC configuration. The control circuit 70 also provides output control signals on lines 90 to activate AC annunicator 40 and to deactivate DC annunciator 38. Switch 81 thus provides the output of converter 18 to terminal 72b-2 and thereby to A/D converter 30 while switching arrangement 82 causes a different scale factor to be applied to the input voltage to be provided to converter 18.

Control circuit 70 additionally provides a control signal on lines 90 for causing AC annunciator 40 to flash in the event that comparators 92 and 24 provide outputs indicative of an input voltage with an AC component between the upper and lower threshold references. The user then has the option of changing switches 72, . . . 72b to the ripple mode by connecting the armatures thereof to poles 72-3, . . . 72b-3. Such a connection is used to force switches 82 to a constant AC display mode, and moreover directly connects the output of converter 18, at terminal 72b-3, to the armature of switch 72b and hence to A/D converter 30.

From the foregoing description it should be appreciated that the present system provides a front end analog override by the AC-DC converter of the DC measurement mode. That is, comparator 24 is constantly connected to receive the output of comparator 18. The output of comparator 24 is used to override the DC function and to the change to AC measurement and display function. As previously described, other connections of the comparators may be used to provide DC override of an AC mode, etc.

Figure 4:
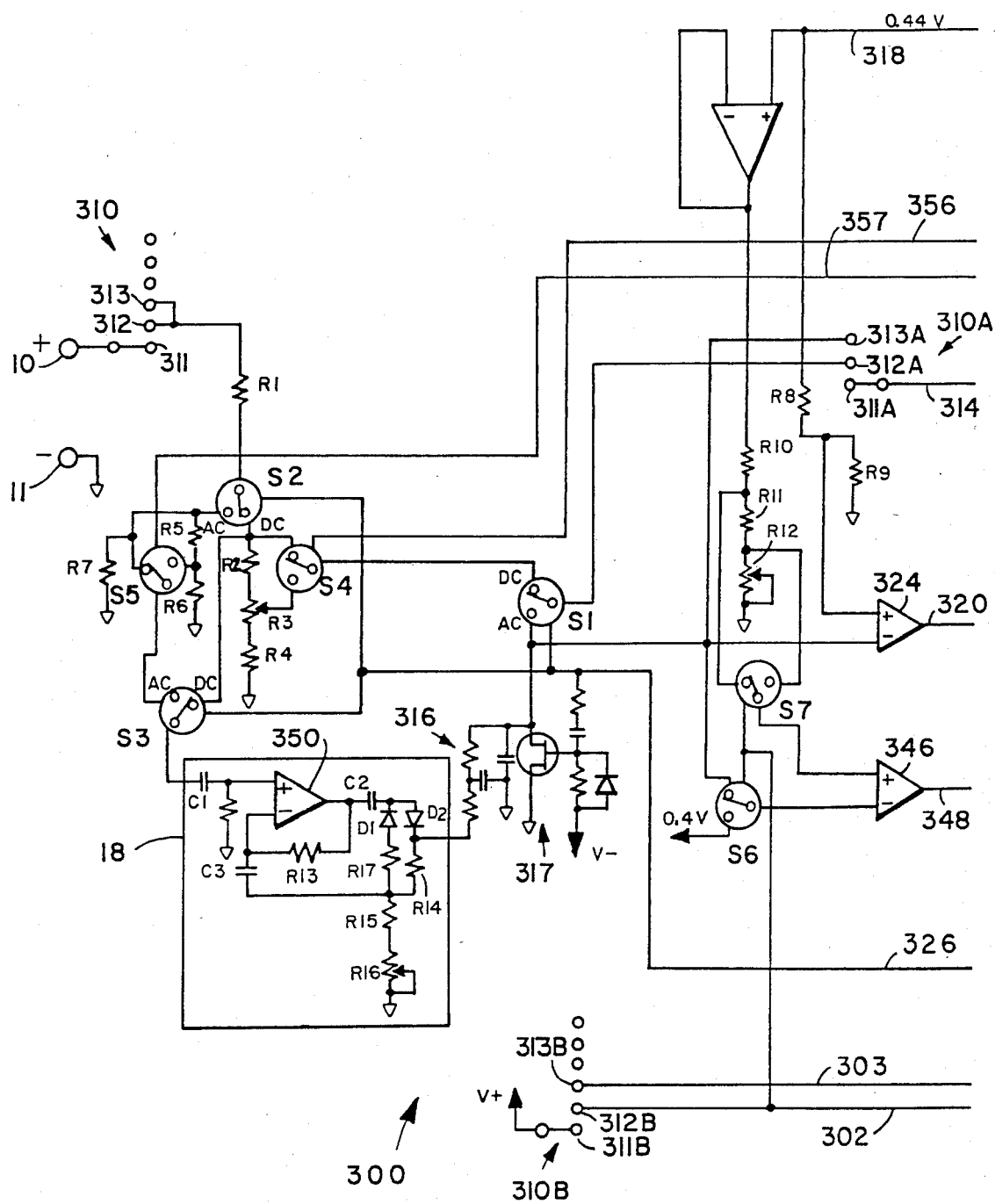
FIG. 4 is a detailed circuit diagram of a specific embodiment of the switching, AC/DC conversion, and comparison functions of FIG. 3.

Referring now to FIG. 4, the switching circuits, the AC-DC converter, the voltage divider and the comparators of FIG. 3 are shown in detail.

An input multi-pole switch 310 is shown connected to the input voltage terminal 10. A ground terminal 11 is provided for the input voltage. Switch 310 is part of a plurality of similar ganged switches, as previously described. See for example 310A and 310B shown in FIG. 4. Various terminals of switch 310 are associated with the different functions performed by the meter. For example, terminals 311, 311A and 311B are associated with the "Off" position. Terminals 312, 312A and 312B are associated with the "Volts" position, and terminals 313, 313A and 313B are associated with the "Ripple", or "AC" position. As seen in the figure, a number of controlled analog switches (for example RCA type 4053 triple 2 channel multiplexer-demultiplexer) are provided at S1-S7. These switches are used for the switches 81, 82 and 86 of FIG. 3 to provide the different functions as well as different ranges of operation for the voltmeter.

As will be observed from the figure, input voltage is applied from terminal 10 through a resistive voltage divider having an input resistor R1 and an output resistor dependent upon the setting of switch S2. With switch S2 set in the DC position, the input voltage is passed to resistors R2, R3 and R4. With switch S2 in the AC position, however, the voltage is passed to resistors R5 and R6. Further, in the AC position, the output of switch S2 is shunted by resistor R7.

It is thus seen that the input voltage, in a DC measurement mode, is divided by the voltage divider comprising resistors R1, R2, R3 and R4. The specific scaling ratio is determined by the setting of switch S4, thereby determining the range of full-scale measurement of the meter. The output of switch S4, passing through switch S1 (also in the DC mode) is provided to terminal 312A. This voltage is the output of the circuitry of FIG. 4, on line 314, when the switch 310 is set to the volts position.

When operating in the AC measurement mode, the input voltage is passed through resistor R1 and switch S2 to resistors R5, R6, and R7; the setting of switch S5 determining the range of measurement for the input AC voltage. This voltage is provided through switch S3 to AC to DC converter 18.

It is noted that converter 18 is connected for receiving the input voltage when operation is in the DC mode as well. That is, switch S3 provides the input voltage at the same scaling ratio as determined by switch S4 for the low range of DC measurement, to converter 18. It is thus seen that the AC to DC converter receives at least a portion of the input voltage in both the AC and DC measurement modes.

A filter 316, comprising two low-pass RC sections, receives the output of AC to DC converter 18 for connection to switch S1. In the AC mode of operation, "Volts" position, controlled analog switch S1 provides the filter output to output line 314 via 312A.

However, whether operating in AC or DC measurement modes, the output of the filter is also passed to the two comparators 324 and 346.

A protective circuit 317 is used to ground the output of filter 16 momentarily upon switching of switch S1. As known in the art, when an analog switch changes states there may occur a brief period of time when the input voltage may be pulled to the negative rail. As will later be described, the control signal for switch S1 is provided on line 326. The same signal is accordingly used momentarily to turn on a FET in the protective circuit, thereby to clamp the filtered output of AC-DC converter 18 to ground, thus to prevent transmission of a possible negative voltage to line 314. After passage of a time period determined by the gate coupling RC circuit, the FET clamp is released, and the output of the converter, 18 is passed on to comparator 324 and to line 314.

A reference voltage of 0.44 volts is provided on line 318 to be used in comparators 324 and 346. A resistive divider comprising resistors R8 and R9 is used to divide down the reference voltage to a level of approximately 200 millivolts to be used as a reference for the non-inverting input of comparator 324. The filtered output of AC to DC converter 18 is provided to the inverting input of that comparator, thereby providing an output signal on line 320 which changes from a high level to a low level when the output of converter 18 exceeds approximately 200 millivolts. As will be seen with reference to FIG. 5, indication of an AC/DC converter signal in excess of 200 millivolts (corresponding to a 20 volt AC input at terminal 10) causes generation of a high signal on input line 326. This signal is connected to control terminals for switches S1, S2, and S3, thereby to change the mode of operation of the voltmeter from the DC to the AC mode. Thus, the present switching circuit is connected for initial operation in a DC mode and for automatic changeover to the AC measurement code when an AC signal greater than a particular threshold, illustratively chosen at 20 volts, is detected on the output terminal. That is, whenever an AC component in excess of 20 volts is detected on terminal 10, the present circuitry causes transfer of the voltmeter into the AC mode. It should be understood that the 20 volt AC signal may be the only signal on the input terminal, or may be a portion of a combined AC and DC signal.

The actual reference voltage level used for comparator 324 is preferably lower than 200 mV, however, in order to assure that the comparator will have fully changed state by the time the input AC voltage reaches 20 volts. Another constraint is used to determine the nominal range of acceptable values of the reference voltage.

Figure 5:
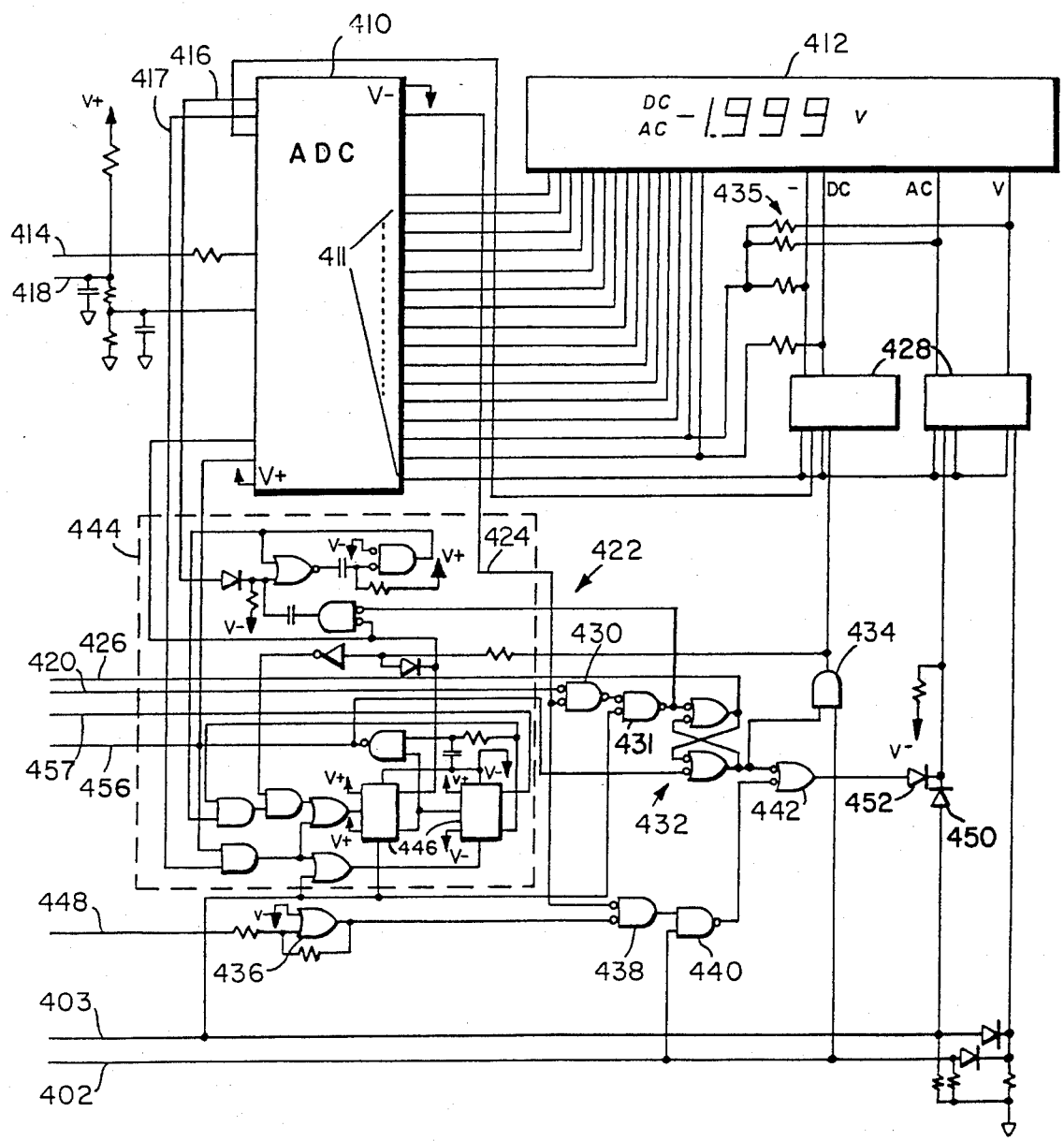
FIG. 5 is a circuit diagram of a specific embodiment of the ranging, A/D conversion, measurement display and logic control functions of FIG. 3.

As will be appreciated upon reference to FIG. 5, over-range and under-range signals are generated by A/D converter 410 to cause switching of analog switches S4 and S5 of FIG. 4. The reference voltage for comparator 324 is chosen to avoid a chattering condition, in which a range change in either AC or DC function leads to a voltage condition at the inverting terminal of the comparator that causes an unwarranted change in function.

Such unwarranted changes are avoided in the present system by choosing a reference voltage of approximately 194 mV for comparator 324.

As is further noted from FIG. 4, the filtered output of AC to DC converter 18 is also passed through control switch S6 to the inverting terminal of comparator 346. Therein, the AC voltage is compared with a further reference provided at the non-inverting terminal through yet another voltage divider, operating on a buffered form of the voltage input on line 318. Resistors R10, R11 and R12 provide a suitable division of that buffered voltage to provide a 20 millivolt reference for comparator 346. Upon detection of an AC signal in excess of 20 millivolts, with the meter operating in the DC mode, comparator 346 provides a negative transition to a logic zero output on line 348 therefrom. As will be seen from the description of FIG. 5, the presence of a low (logic zero) signal on line 348 combined with a high signal on line 320 when the meter is in the volts measurement mode leads to the flashing of an annunciator, thereby alerting an operator that an AC (ripple) signal in excess of two volts (but less than 20 volts) exists on the input line connected to terminal 10. The operator may then obtain the DC reading and may, if so desired, set switch 310 to the Ripple mode by connecting the armature thereof to terminal 313. In the Ripple mode, the output of switch S1, on terminal 312A, is no longer provided as the output of the circuitry of FIG. 4 on line 314. Rather, the filtered output of the AC to DC converter, which is connected to terminal 313A, is provided on output line 314. The status of switches S2 and S3 remains "DC" so that the input to the AC to DC converter is still obtained through switches S2 and S3 at the voltage division ratio previously provided.

Meter function control switch 310, having been set to the Ripple mode of operation for measurement of small AC voltages, thus provides connection of a positive supply voltage to terminal 313B, rather than to terminal 312B. With the positive supply voltage on terminal 313B, lines 303 and 403 are at a logic one, forward biasing diode 450, which causes the AC annunciator gate of 428 to stay "on", in turn maintaining a constant display of the "AC" annunciator. In addition, the presence of a logic one level on line 403 keeps flip flops 446 in a "RESET" condition, defeating any "UP RANGE" or "DOWN RANGE" signals. If an overrange condition is reached while in "RIPPLE", indicated by a flashing display, it is indicative that the signal is greater than 20 volts AC and can be read on the "VOLTS" range.

Referring now to the AC to DC converter 18 shown in FIG. 4, it is seen that a DC blocking capacitor C1 eliminates any DC voltage from passing through to a linear amplifier 350. Amplifier 350 is provided with a DC feedback path comprised of resistor R13 which sets the amplifier to operation as a standard, non-inverting balanced amplifier. An AC feedback path includes capacitors C2 and C3, resistors R14 and R17, and diodes D1 and D2. The diodes separate the positive-going from the negative-going portions of the AC signal, diode D1 being connected to resistor R17 to form the feedback path for the non-used negative half of the converter output. Gain adjustment for the AC to DC converter is provided by resistors R14, R15, R17, and a variable resistor R16 such that the average value of the output of filter 316 equals the RMS value of the scaled input, when that input is a pure sinewave. In the "Ripple" or "AC" range comparators 324 and 346 have no function, since auto ranging is inhibited.

Referring now to FIG. 5, there is shown a voltage measurement and display system, and a timing control circuit therefor, responsive to voltages provided by the circuitry of FIG. 4.

Lines extending from FIG. 5 for connection to the circuitry of FIG. 4 have been numbered in accordance with the numbering of the lines on FIG. 4. Thus, lines 402, 403, 414, 418, 420, 426, 448, 456, and 457 connect respectively to lines 302, 303, 314, 318, 320, 326, 348, 356, and 357. As has been previously described, the inventive circuitry relates to the voltage measurement and ripple measurement connections of the ganged control switch 310.

Referring specifically to the circuitry of FIG. 5, there is shown an analog-to-digital converter (ADC) 410. ADC 410 receives the input voltage applied to input terminal 10 of FIG. 4, after appropriate voltage division and, or AC to DC conversion, on its input line 414. The converter provides digital output signals on output lines 411 thereof to a display 412. The converter 410 and display 412 are available from the Epson division of Suwa Seiko Company of Japan under the designations 7542A and LDB 7041A. A similar analog-to-digital converting, autoranging chip is available under the designation ICL 7139 from the Intersil Company.

Converters of the type provided at 410 provide output range changing signals, such as shown at lines 416 and 417, for changing the measurement range upwardly or downwardly, respectively.

The circuit shown at 70 in FIG. 3 is shown in detail at 422 for coordinating with signals generated by the circuitry of FIG. 4 and the ADC 410 in order to generate changing control signals for the various switches of FIGS. 3 and 4, as well as for generating control signals for switching from DC to AC measurement, and vice versa. Moreover, logic circuits are provided at 428 for controlling the display of AC or DC annunciators, as well as for providing the flashing of an AC annunciator to indicate the presence of ripple voltage in a DC measurement. Operation of the circuitry of FIG. 5 may be understood from the following description.

It will be recalled that line 402 is provided with a positive voltage when switch 310 is set to the volt measurement mode. As will be recalled from FIG. 4, initial switch settings are provided for DC measurement in a particular range (20 volt DC). A switching arrangement is provided in control circuitry 422 for setting the voltage on line 426 to a logic one when an AC voltage in excess of 20 volts is present on input terminal 10. As will be recalled, the presence of such an AC voltage results in the switching of comparator 324 to a logic zero output. Thus, line 320, and hence line 420 of FIG. 5, are set to like "zero" levels.

ADC 410 supplies an approximately 2 Hertz signal on line 424 which is input to an inverting NAND (or OR) gate 430 along with the signal on line 420. When both signals are at a logic zero, the output of gate 430 goes low. This signal, along with a signal from line 403, when both are low, set the output of gate 431 low, causing the flipflop connection at 432 to change its state, providing a high output voltage on line 426, thereby further providing the needed control voltage on line 326 for controlling switches S1, S2 and S3 to switch them to the AC measurement position.

Simultaneously, the inverse of the signal on line 426 is combined in an AND gate 434 with the signal on line 402. The output of gate 434 is provided as an input to one of the chips used to form logic circuit 428, which essentially comprises a number of type 4066 bilateral switches, functioning in combination with resistors 435 similarly to exclusive-OR gates. Specifically, the A/D converter 410 provides a multiplexed backplane signal to display 412. The specific annunciators controlled by circuit 428 are connected via pull-down resistors 435 to the appropriate backplane signal. The annunciators are also directly connected to the output of the bilateral switches in circuit 428. The input to each of the switches of circuit 428 is the appropriate inverted backplane signal output from converter 410. Thus, when the control signal provided to a particular switch is high, the inverted backplane signal is connected to the annunciator controlled thereby. When the control signal is low, the annunciator receives the backplane signal via the pull-down resistors 435. The output of AND gate 434 is used to control the DC annunciator in display 412. Thus, while one output of flip-flop connected gates 432 causes the voltage on line 426 to rise indicating an AC operating condition, the other output drops, causing the output of gate 434 to drop, thus providing a logic zero for the bilateral switch controlling the DC annunciator. As previously described, a backplane signal is provided to the annunciator, which thus extinguishes it. As will similarly be appreciated, when the measurement device of the present invention is operating in the Volts measurement mode, and the output of comparator 324 has not been lowered by detection of an AC voltage, the output of AND gate 434 will be at a logic one level, thereby maintaining the DC annunciator in its active display mode. Upon detection by comparator 346 in FIG. 4 that an AC voltage in excess of the lower threshold of two volts is present during DC measurement in the Volts operating mode, line 448 drops in value, thus providing a drop in the output of a buffer connected OR gate 436. The output of gate 436 and the 2 Hertz square wave of line 424 feed gate 438. Whenever line 448 is low, the signal on line 424 is inverted by gate 438, and passed to the input of NAND gate 440. NAND gate 440 receives a control input from line 402, thus providing an output square wave signal when, in the Volts measurement mode, the output of comparator 346 indicates the presence of an AC voltage in excess of the ripple voltage measuring threshold. The output signal from gate 440 is combined in an inverting NOR gate 442 with the inverse of the voltage on line 426 as provided by the flipflop connection at 432 described above. Thus, when the voltage on line 426 is low (DC measurement mode) the output of OR gate 442 will be low if no AC signal is detected by comparator 346, and will be a 2 Hertz oscillating signal when AC is detected. This oscillating signal, is diode-OR connected to a bilateral switch in one of the chips forming logic circuit 428 for controlling the AC annunciator in display 412. The oscillating signal is thus used to cause the AC annunciator to flash. It is noted, however, that operation in the ripple mode, in which line 403 is provided with a high voltage, causes a high voltage level to be input to the switch controlling the AC annunciator in control circuit 428 via diode 450, thereby providing a steadily active AC annunciation independent of gate 442. When the meter is switched to the Ripple mode line 402 goes low, disabling AND gate 434, thereby extinguishing the DC annunciator.

It is accordingly seen that the display 412 provides both AC and DC annunciators, the AC annunciator operating in a steady display mode either in a Ripple measurement mode or in the event of detection of an AC voltage above the high threshold selected to cause automatic transfer to the AC measurement function. The AC annunciator further is caused to flash when an AC ripple voltage is detected in the DC measuring mode.

Range changing signal lines 416 and 417, output by ADC 410, are provided with appropriate delays by a circuit 444, including a pair of JK flipflops 446 and other logic gates therein to prevent chattering in the ranging control. The appropriately delayed signals 416 and 417 are output as range status signals on lines 456 and 457 to the switching circuitry of FIG. 4. These lines, shown at 356 and 357 in FIG. 4, are used to control range changing switches S4 and S5 in order to provide appropriate voltage scaling and gain control thereby to result in a 200 millivolt full-scale signal on line 314 for the various ranges selected for measurement.

The present invention thus provides a voltage measurement and display circuit for automatically measuring AC or DC voltages. A DC voltage is assumed unless an AC voltage above a first threshold is detected, in which case AC volts are measured and an AC annunciator is activated. If an AC ripple voltage is detected on a DC voltage being measured, between the first threshold and a second, lower threshold, the AC annunciator is caused to flash, thereby alerting the operator to the presence of the ripple voltage and advising the operator to switch the mode of operation to a ripple voltage measurement function. In order to provide fast operating circuits, analog, rather than digital comparators are provided. A number of controlled switches are used to change the measurement function, as well as to change the range of voltage being measured.

The foregoing description of the preferred embodiment of the invention has been presented for purposes of illustration and description. It is not intended to be exhaustive or to limit the invention to the precise form disclosed, since many obvious modifications and variations are possible in light of the above teaching. The embodiment described was chosen in order best to explain the principles of the invention and its practical application, thereby to enable others skilled in the art best to utilize the invention in various embodiments and with various modifications as are best suited to the particular use contemplated. It is intended that the scope of the invention be defined by the claims appended hereto, when interpreted to obtain the full breadth to which they are fairly and legally entitled.

We claim:

1. In a measuring device for an input voltage, which device has an input voltage means for receiving the input voltage, an AC to DC converter means for providing a DC output voltage, and a measurement and display means; a circuit structure for changing operating function between AC and DC measuring and display modes, which circuit structure is operatively connected with the input voltage means, the AC to DC converter means, and the measurement and display means, the circuit structure comprising:
   comparing means connected for comparing a portion of the input voltage with a first reference voltage and for providing an output signal having states indicative of the result of the comparison,
   controlled switching means responsive to the output signal of said comparing means for connecting and disconnecting the output voltage of the AC to DC converter means to and from, while at substantially the same time disconnecting and connecting the input voltage from and to, the measurement and display means,
   whereby input voltages are automatically measured and displayed as AC voltages with AC to DC conversion whenever the input voltages have an AC component of a particular relation to the first reference voltage.

2. The circuit structure recited in claim 1 wherein said comparing means is connected for comparing the converter means output voltage with said first reference voltage and for providing an output signal indicative of the magnitude of an AC component of the input voltage relative to said first reference voltage.

3. The circuit structure recited in claim 2 wherein said control switching means comprises means for determining the state of said comparing means output signal and for providing control signals to the controlled switching means for connecting the converter means output voltage to the measurement and display means when said output voltage is greater than the first reference voltage.

4. The circuit structure recited in claim 3 further comprising function display means for displaying AC and DC modes of operation.

5. The circuit structure recited in claim 4 further comprising second comparing means for comparing the converter means output voltage with a second reference voltage lower than the first reference voltage, and display control means responsive to said second comparing means for causing said function display means to provide an indication that an input DC voltage has an AC component having a converted DC output voltage in the range between said first and second reference voltages.

6. The circuit structure as recited in claim 5 wherein said function display means comprises a liquid crystal display annunciator indicating the presence of an AC signal, and said display control means comprises means for activating said annunciator in a first mode when said converter means output voltage is in the range between said first and second reference voltages, and in a second mode when said converter means output voltage exceeds said first reference voltage.

7. The circuit structure as recited in claim 6 wherein said means for activating comprises means for flashing said LCD annunciator in one of said first and second modes and for continuously displaying said LCD annunciator in the other of said first and second modes.

8. The circuit structure as recited in claim 7 wherein said means for flashing and for continuously displaying said annunciator comprises exclusive-OR gate means for providing a signal to said annunciator in phase and out of phase with a back plane signal therefor.

9. The circuit structure as recited in claim 8 wherein said exclusive-OR gate means is connected to receive said back plane signal at a first input and to receive a variable signal at its other input, from a circuit providing a logic zero signal when said converter means output voltage exceeds said first reference voltage, a logic one signal when said converter means output voltage is lower than said second reference voltage, and a signal alternating between logic one and logic zero levels when said converter means output voltage is between said first and second reference voltages.

10. The circuit structure as recited in claim 1 further comprising autorange circuit means connected for providing said input voltage to said controlled switching means, thereby automatically providing DC voltages of plural ranges for measurement and display.

11. The circuit structure recited in claim 1 or 10 further comprising autoranging circuit means connected to said AC to DC converting means for providing converted AC voltages of plural ranges for measurement and display.

12. In a measuring device for an input voltage, the device having an input voltage means for receiving a voltage to be measured, an AC to DC converter means operatively connected to the input voltage means for providing a DC output voltage, and a measurement and display means having function annunciator means for indicating the nature of the measured voltage as AC or DC; a circuit structure for activating a specific annunciator to indicate measurement of a specific type of voltage, the circuit structure being operatively connected with the input voltage means, the AC to DC converter means, and the measurement and display means; the circuit structure including:
   first means for measuring a first type of voltage;
   second means for measuring a second type of voltage;
   control means connected to one of said first and second measuring means for controlling the specific annunciator to operate in a first mode when said first type of voltage is being measured, in a second mode when said second type of voltage is being measured, and in a third mode when a voltage having a small component of said first type is being measured.

13. The device of claim 12 wherein said control means comprises means for causing the specific annunciator to be continuously on when said first type of voltage is measured, to be off when said second type of voltage is measured, and to flash when a voltage having a small component of said first type is being measured.

14. The device of claim 13 wherein said first type of voltage comprises AC voltage, and said second type of voltage comprises DC voltage.

15. A device for measuring an input voltage, the device comprising:
   an input voltage means for receiving the input voltage;
   an AC to DC converter operatively connected to the input voltage means for providing a DC output voltage;
   a comparing means operatively connected with the AC to DC converter for comparing the converter DC output voltage with a first reference voltage and providing a comparing means output signal indicative of the result of the comparison;
   a measurement and display means for converting a received voltage to a man-readable display indicative of the magnitude thereof, the measurement and display means including an annunciator for indicating whether AC or DC voltage is being measured;
   controlled switching means responsive to the comparing means output signal for selectively connecting the measurement and display means with one of the AC to DC converter and the input voltage means, while substantially simultaneously disconnecting the measurement and display means from the other of the input voltage means and the AC to DC converter, the controlled switching means being operatively connected with the measurement and display means and the comparing means; and,
   an annunciator control means operatively connected to at least one of the input voltage means and the AC to DC converter for controlling the annunciator to operate in a first mode when the AC voltage is being measured, in a second mode when DC voltage is being measured, and in a third mode when DC voltage having a small AC component is being measured, the annunciator control means being operatively connected with the measurement and display means.

* * * * *